United States Patent [19]
Brault et al.

[11] 4,036,647
[45] July 19, 1977

[54] PACKAGE FOR MAKING PHOTOPOLYMERIZED PLATES

[75] Inventors: Robert G. Brault, Santa Monica; Cesar C. DeAnda, Santa Susana; Joe A. Jenney, Los Angeles; John D. Margerum, Woodland Hills, all of Calif.

[73] Assignee: Hughes Aircraft Company, Culver City, Calif.

[21] Appl. No.: 298,715

[22] Filed: Oct. 13, 1972

[51] Int. Cl.$^2$ .............................................. G03C 1/48
[52] U.S. Cl. .................................. 96/76 C; 96/76 R; 96/67; 96/115 P; 354/301; 354/303; 354/304; 206/316
[58] Field of Search ............. 96/76 C, 76 R, 67, 35.1, 96/115 R, 115 P; 354/301, 303, 304; 206/316; 260/95 R

[56] References Cited
U.S. PATENT DOCUMENTS 3,615,456  10/1971  Touchette et al. ................... 96/35.1

Primary Examiner—Edward C. Kimlin
Attorney, Agent, or Firm—Booker T. Hogan, Jr.; W. H. MacAllister

[57] ABSTRACT

An improved package for photopolymerized recording materials is disclosed. The package consists essentially of a cover plate, a substrate spaced apart from said cover plate, at least one of the said cover plate or said substrate having a coating on an internal surface of a photopolymerizable compound or a catalyst therefore, and fluid ingress means for introducing fluid into the space between said cover plate and said substrate. In a particularly preferred embodiment the ingress means is associated with a collapsible vessel located outside the basic package. Also disclosed are methods for using the package such as in holographic nondestructive testing.

8 Claims, 6 Drawing Figures

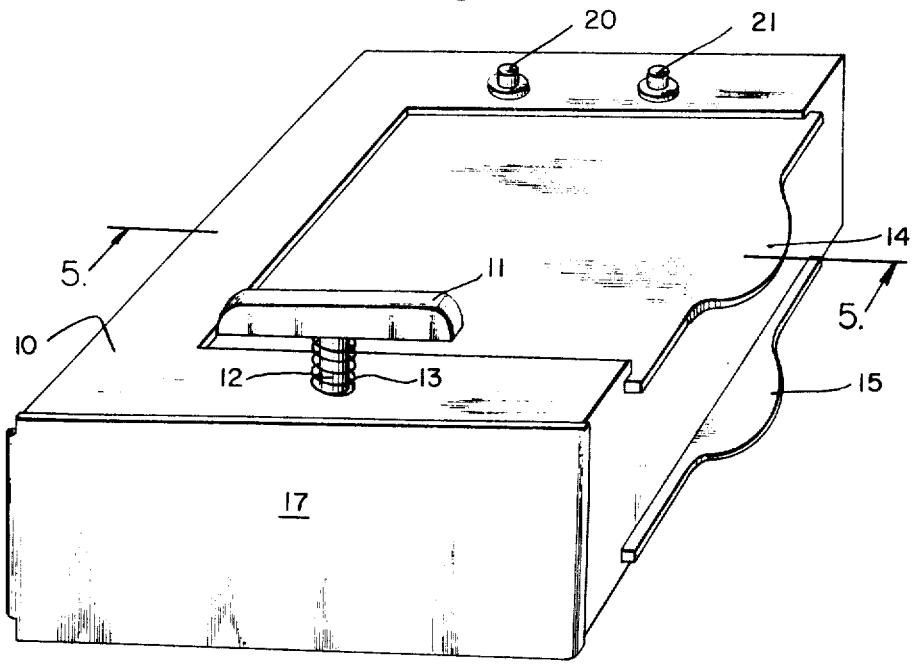
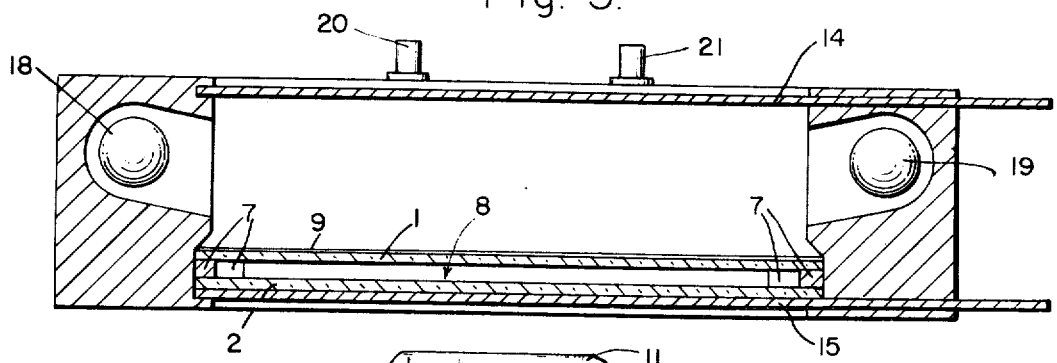
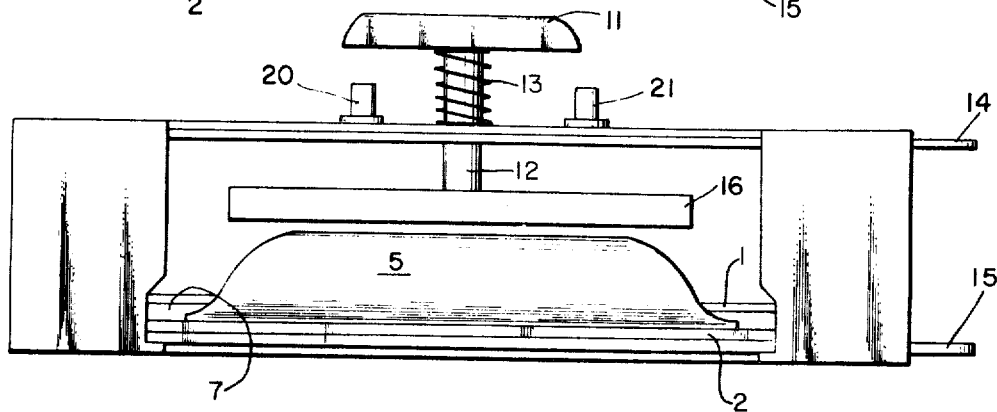

PACKAGE FOR MAKING PHOTOPOLYMERIZED PLATES

BACKGROUND OF THE INVENTION

The use of photopolymer plates has been previously described, cf Hologram Recording on Photopolymer Materials, D. H. Close et al, Applied Physics Letters, Vol. 14, pp. 159–160. As noted in that article, the photopolymerizable systems deteriorate rapidly if not exposed. Hence, the components had to be mixed shortly before use.

Brief Description of the Invention

In accordance with the present invention, a package for taking a photopolymerized picture is described. This package has extended shelf life and is readily utilizable when desired. It provides ease of handling as compared to prior art methods and is especially useful in holographic recording such as holographic nondestructive testing.

Brief Description of the Drawings

FIG. 4 is a perspective view of a camera which may be used to expose the photographic plates of the present invention;

FIG. 5 is an enlarged transverse vertical section of the camera in FIG. 4 taken across line 5—5;

FIG. 6 is an enlarged transverse vertical section of said camera taken with hinged end open.

DESCRIPTION OF THE INVENTION

The present invention provides a new package for photopolymerizable materials. The package has an extended shelf-life, requires a minimum of handling or preparation before exposure, and does not substantially reduce the sensitivity or resolution of the photopolymer.

Figure 1:
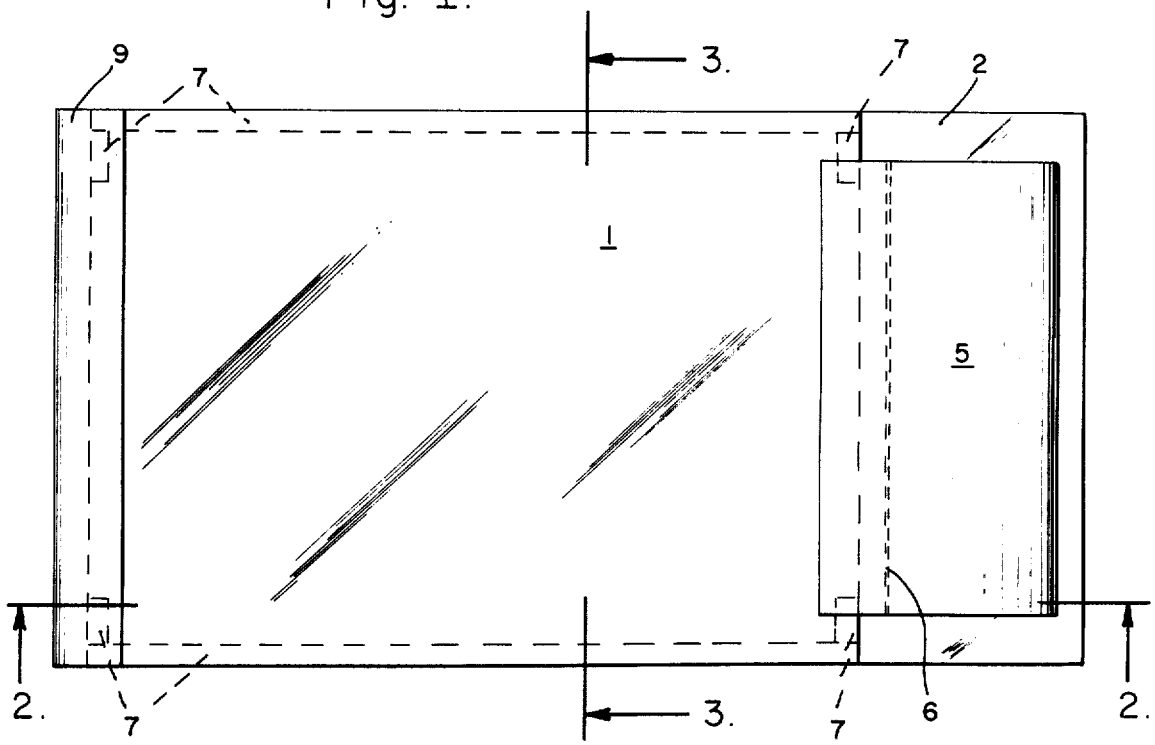
FIG. 1 is a plan view of a package for taking photopolymerizeable pictures according to the present invention.
Figure 2:
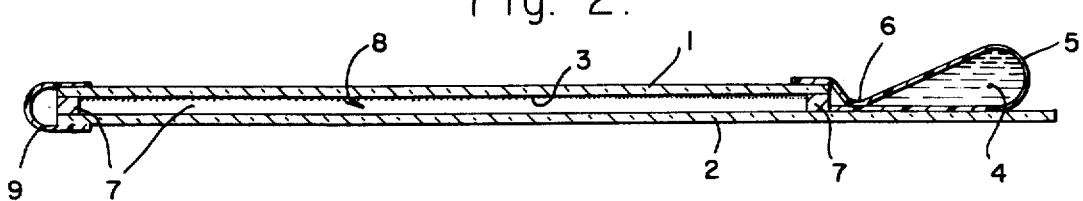
FIG. 2 is a longitudinal vertical section taken on the line 2—2 of FIG. 1.
Figure 3:
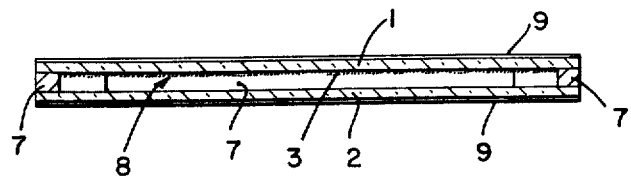
FIG. 3 is a transverse vertical section taken on the line 3—3 of FIG. 1.

The present invention will be described with reference to the drawings wherein the same number refers to the same structure or component. One plate or package with which this invention is concerned is shown in plan view in FIG. 1 and in cross-sectional views in FIGS. 2 and 3. The plate has cover plate 1 and substrate 2. Cover plate 1 is transparent, and substrate 2 may be transparent. A catalyst solution is plated in a thin gel-like layer 3 on the inner surface of either cover plate 1 or substrate 2. A polymerizable solution 4 is contained in a collapsible sack 5 which in turn is equipped with a break-away seal 6. In this embodiment, seal 6 will rupture upon application of pressure to sack 5, allowing the contents of said sack to squeeze through an opening (not shown) in spacer 7 into space 8 between cover plate 1 and substrate 2. Space 8 between cover plate 1 and the substrate 2 is adjusted by spacer 7 so that the polymer solution will readily fill space 8 and wet the entire surface of the catalyst layer. Typically, space 8 will be from ¼ to 1 mil in depth. In this embodiment, escape means 9 is provided at the opposite end from collapsible sack 5 to permit escape of any excess solution from space 8.

FIGS. 4, 5 and 6 are different views of a camera which may use the plates of the present invention.

FIG. 4 shows a perspective view of camera 10 which is useful with the photopolymerizable packages of the present invention. Handle 11, plunger rod 12 and spring 13 are shown at an end of the top surface of camera 10. Dark slides 14 and 15 are also shown.

FIG. 5 shows an enlarged transverse vertical section of camera 10 along line 5—5 of FIG. 4. It shows the relationship of the plate in spaced relationship to dark slides 14 and 15 and also the relative positions of horizontal light means 18 and 19. Light switches 20 and 21 turns lights 18 and 19, respectively, on and off.

FIG. 6 is an enlarged transverse vertical section of said camera with hinged end 17 open.

Plate A is inserted into the camera by opening hinged end 17, means (not shown) can be provided to hold the plate in a fixed position. Collapsible sack 5 rests on substrate 2 and is positioned directly under pressure plate 16. Pressure plate 16 is operatively connected through plunger rod 12 to handle 11. Pressure plate 16 is forced against collapsible sack 5 by pushing handle 11 downward. Pressure on collapsible sack 5 causes break-away seal 6 to rupture and the contents 4 of collapsible sack 5 are forced through an opening (not shown) in spacer 7 into space 8. Handle 11 is returned to its original position by spring 13 upon release of downward pressure on handle 11.

In another variation a photopolymerizable layer may be coated on substrate 2 or cover plate 1. The appropriate catalyst solution is kept in collapsible sack 5.

In still another modification, either cover plate 1 or substrate 2 is coated with a layer of monomer in a "tacky" or semi-dry state. The other structure is coated with a gelatin layer containing the catalyst and sufficient additional water for the total solution. The two plates are separated with a removable or collapsible spacer (not shown) in space 8 so that the two coated layers do not touch each other until just before exposure. At that time the layers are brought into contact and the monomer layer breaks down the gelatin. This allows the monomer and catalyst to go into solution.

For applications requiring a continuous film strip (e.g., holographic nondestructive testing on a production-line basis), other variations (not shown) of the configurations described above may be used. For example, two films, one coated with a tacky monomer layer and the other coated with a catalyst/gelatin layer, can be brought into contact just before exposure on a continuous basis. If necessary, the tacky monomer layer can be protected with a thin cover film to permit storing the monomer coated film in a roll. Such techniques have been previously employed for tacky monomer coatings. A second alternative would be to coat the monomer layer on the catalyst/gelatin layer just before exposure. This can be accomplished with a single or double layer of film stock; i.e., the monomer could be coated on top of the catalyst layer or on a cover film that would then be brought into contact with the catalyst film.

Compositions which are useful in the present system include a catalyst solution prepared by dissolving 5 grams gelatin in water, adding 1.6 g sodium benzenesulfinate, 10 ml of a $6 \times 10^{-2}$ M methylene blue solution and diluting with water to 10 ml. Just before use one drop formalin was added to 5 ml of the above solution. The final catalyst solution was 0.1 M in sodium benzenesulfinate, $10^{-3}$ M in methylene blue, 5% gelatin by weight, had a pH of 6.3, and had about 0.3% formalin as a hardening agent. This solution was coated on glass plates as a uniform thin coating by a spinning technique. The glass slide was completely covered with the solution which had been warmed to 30° C. The covered slide was accelerated to ~ 3600 rpm as rapidly as possible and spun at that speed for 1 minute. The coating was then allowed to harden by standing in air. The coated slide can be then used as coated cover plate 1 or substrate 2.

A monomer solution was prepared by adding 1010 g barium hydroxide hexahydrate and 173 g lead oxide (PbO) to a solution of 516 cc acrylic acid in 250 cc water. When solution was complete, 80 grams of decolorizing charcoal was added. After stirring for ½ hour the solution was filtered. 360 grams acrylamide was added to the filtrate and the pH of the solution adjusted to 8.5 by adding acrylic acid or barium hydroxide. This final monomer solution was about 2.25 M in barium acrylate, 0.52 M in lead acrylate and 3.3 M in acrylamide. Approximately 1 ml of this solution was used to fill collapsible sack 5.

When the monomer solution is forced into contact in space 8 with the catalytic coating on cover plate 1, the high concentration of monomer and ions in the monomer solution causes the gel layer to break down and diffuse into the monomer solution. This tends to occur too rapidly in gelatin coatings without a hardener, and the coating is washed away before the monomer solution is spread out evenly over it. A hardener such as formalin is used to control the mixing rate so that a uniform photo-sensitive film is formed spontaneously shortly after the monomer solution is spread out over the coating. The resultant solution has essentially the same response characteristics to light exposure as a freshly prepared photopolymerizable solution with the same composition.

Other monomer solutions useful in this invention include those in which the lead acrylate is replaced with any of a number of metal acrylates such as potassium, sodium, strontium, or neodymium acrylate. Still other monomer solutions may be mixtures of acrylamides, such as an aqueous solution of 40% acrylamide and 6% N,N'methylenebisacrylamide or 50% diacetoneacrylamide and 5% N,N'methylenebisacrylamide, wherein the percents are by weight.

The benzenesulfinate catalyst can be replaced with a similar concentration of another benzene sulfinate salt such as sodium-p-toluenesulfinate, p-chlorobenzenesulfinate, p-bromobenzenesulfinate or p-acetamidobenzenesulfinate. Sulfones such as hydroxymethylbenzene sulfone, hydroxymethyl-p-toluene sulfone or hydroxymethyl-p-acetamidobenzene sulfone are also effective catalysts.

In actual operation, a plate of this invention is loaded into the camera through the opening provided when hinged end 17 is open, as illustrated in FIG. 6. The camera is then made light tight by securing hinged end 17 and putting dark slides 14 and 15 in place. By pressing down on handle 11 and forcing pressure plate 16 against collapsible sack 5, the contents of sack 5 are forced into space 8 and into contact with layer 3. The photopolymerizable film thus produced may be presensitized, if desired, by turning on lights 18 and 19 for a brief time by means of switches 20 and 21. Switches 20 and 21 are electrically connected by a system (not shown) to lights 18 and 19 and to an external power source (not shown). The film is exposed to the holographic process by removing dark slide 14, after which the hologram may be fixed by turning on lights 18 and 19. If substrate 2 is transparent, the resultant reconstruction can be viewed in place by removing dark slide 15.

The novel plates of this invention may be imaged and fixed in the same manner as photopolymerizable plates of the prior art. Details of these processes are set out in Photopolymerization Studies: I, Polymers from New Photoredox Catalyst System, J. B. Rust, et al, Polymer Engineering and Science, Vol. 9, p. 40, 1969; Photopolymerization Studies: II, Imaging and Optical Fixing, J. D. Margerum, et al., Photographic Science and Engineering, Vol. 12, pages 177–184, 1968; Photopolymerization Studies: III, Thermal Sensitization and Desensitization Effects, J. B. Rust, et al., Polymer Preprints, 157 ACS Meeting 294, (April 1969); Fixing of Photopolymer Holograms, J. A. Jenney, Journal of the Optical Society of America, Vol. 61, pages 1116–1117, 1971.

The spectral range of the photographic plate may be extended by using other dyes either alone or mixed with smaller concentrations of methylene blue. Dyes such as proflavine, acridine yellow, acriflavine, eosin yellowish, safranine O, or thionine can be used.

The photopolymer plates of this invention are very useful for holographic nondestructive testing (HNDT). They have three distinct advantages over conventional silver halide plates now employed for that purpose. First, the recorded hologram can be played back immediately because no chemical processing is required. Second, there is no need for the costly and complicated liquid gate processing systems now necessary for those HNDT applications that require reconstructing the hologram in the exact position that the exposure was made. Third, the photopolymer materials are phase recording materials so that they provide higher diffraction efficiency holograms than silver halide plates, which are amplitude recording materials. In addition, it is likely that the cost of the photopolymer plates will be less than the cost of silver halide plates.

What is claimed is:

1. A new and improved method of storing components of photopolymerizable composition used in the recording of photopolymer images and photopolymer holograms wherein a monomer solution is separated from a photo-catalytic solution prior to the formation of said photopolymerizable composition comprising storing said monomer solution in a collapsible container separated from said catalytic solution which has been coated onto a substrate separated by spacers from a cover plate connected to said container by a fluid ingress means and a breakaway seal.

2. The method of claim 1 wherein said catalytic solution is comprised of a mixture of a benzenesulfinate, methylene blue and gelatin in water which has been rendered resistant to deformation during coverage by said monomer by the addition of samll amounts of formalin and is succeptable to diffusion into said monomer subsequent to having been covered by said monomer.

3. The method of claim 2 wherein said benzenesulfinate is sodium benzenesulfinate.

4. The method of claim 2 wherein said catalytic solution has been coated onto said cover plate.

5. A method of storing components of a photopolymerizable composition comprising forming a package consisting of a substrate separated from a cover plate by a spacing means and a container wherein said substrate is coated with a solution of a catalyst in a gel and wherein said container, containing a monomer solution, is separated from said substrate by a fluid ingress means and a breakway seal.

6. The package of claim 5 wherein said catalytic solution is comprised of a solution of a benzenesulfinate and methylene blue in water having a trace of formalin added as a hardner in gelatin and wherein said monomer solution is comprised of a mixture of acrylates and acrylamides.

7. The package of claim 5 wherein said benzenesulfinate is sodium benzenesulfinate, and said mixture of acrylates and acrylamides is comprised of barium acrylate, lead acrylate, and acrylamide.

8. A new and improved method of storing components of a photopolymerizable composition wherein a monomer solution is separated from a photo-catlytic solution prior to the formation of said photopolymerizable composition comprising coating said catalytic solution onto a cover plate separated from a substrate having a coating of said monomer by a collapsible spacer means which when collapsed allows said cover plate to contact said substrate thereby initiating a diffusion process for formation of said photopolymerizable composition.

* * * * *